United States Patent
Park et al.

(10) Patent No.: US 8,593,884 B2
(45) Date of Patent: Nov. 26, 2013

(54) DATA STORAGE SYSTEM AND A DATA RETENTION METHOD THEREOF

(75) Inventors: Dae-Kyu Park, Seoul (KR); Mi Kyoung Jang, Seoul (KR); Dong Gi Lee, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 59 days.

(21) Appl. No.: 13/431,536

(22) Filed: Mar. 27, 2012

(65) Prior Publication Data

US 2012/0272024 A1    Oct. 25, 2012

(30) Foreign Application Priority Data

Apr. 25, 2011   (KR) ......................... 10-2011-0038563

(51) Int. Cl.
*G11C 16/04* (2006.01)
(52) U.S. Cl.
USPC ............. 365/189.011; 365/233.1; 365/189.09
(58) Field of Classification Search
USPC ............. 365/189.011, 233.1, 189.09, 189.05, 365/189.14
See application file for complete search history.

(56) References Cited

U.S. PATENT DOCUMENTS 7,325,090 B2    1/2008  Ronen
8,130,582 B2 *  3/2012  Shimano et al. ....... 365/189.011

FOREIGN PATENT DOCUMENTS

JP    2008-310888    12/2008
JP    2010-015665    1/2010
KR    1020070010137  1/2007

* cited by examiner

*Primary Examiner* — David Lam
(74) *Attorney, Agent, or Firm* — F. Chau & Associates, LLC

(57) ABSTRACT

A data retention method that includes sampling a plurality of nonvolatile memory devices included in a data storage device to detect retention information for each of the nonvolatile memory devices in response to a request of a host and outputting, from the data storage device to the host, sampling data based on a result of the sampling, determining, at the host, whether to perform a retention operation on each of the nonvolatile memory devices based on the sampling data, and performing the retention operation on each of the nonvolatile memory devices based on a result of the determination.

20 Claims, 12 Drawing Sheets

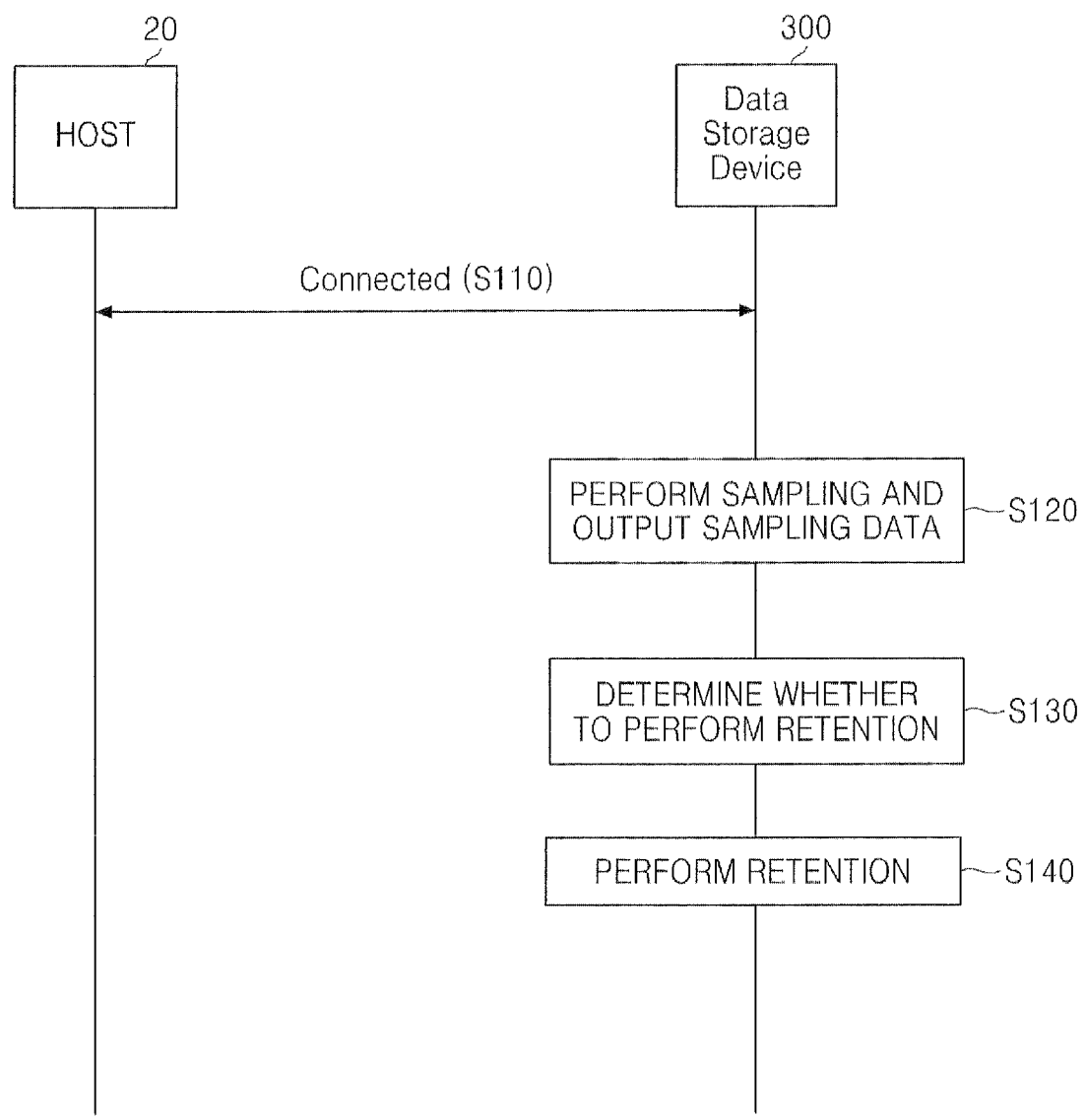

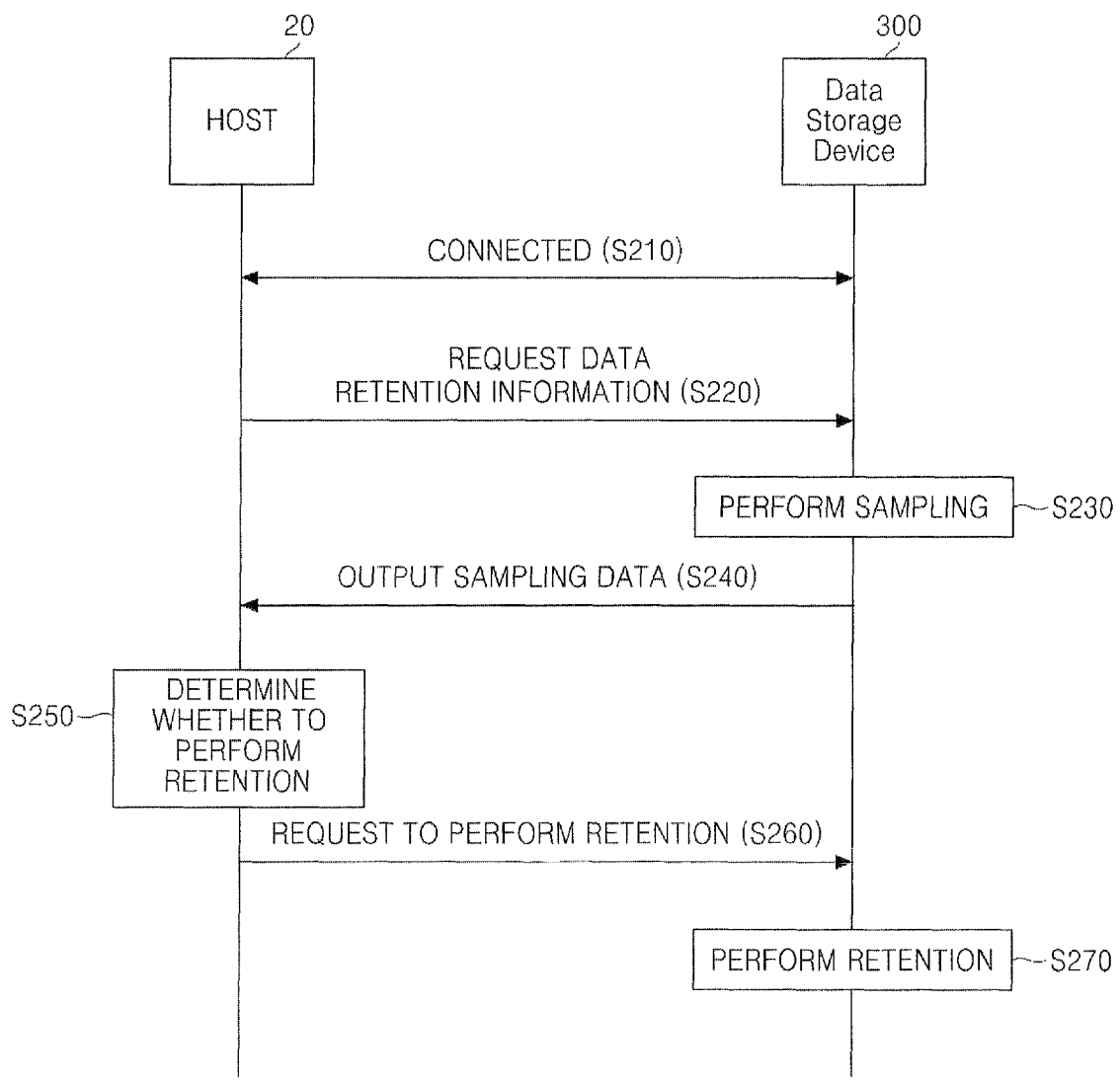

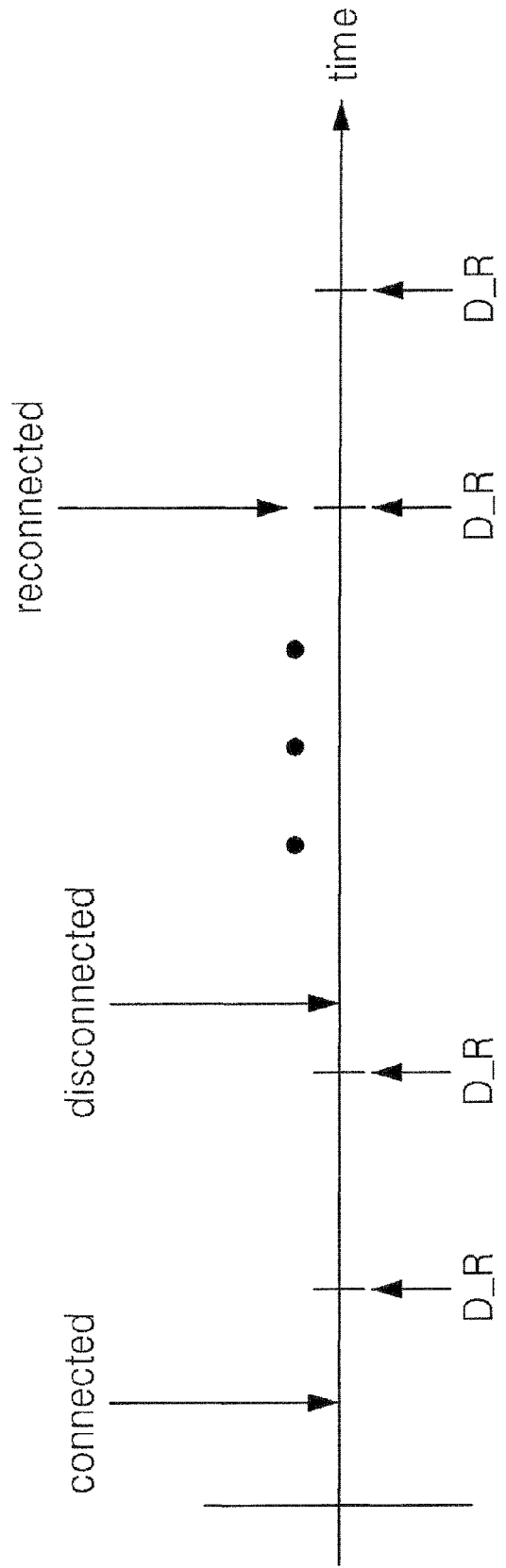

DATA STORAGE SYSTEM AND A DATA RETENTION METHOD THEREOF

CROSS-REFERENCE TO RELATED APPLICATION

This application claims priority under 35 U.S.C. §119(a) to Korean Patent Application No. 10-2011-0038563 filed on Apr. 25, 2011, the disclosure of which is incorporated by reference herein in its entirety.

BACKGROUND

1. Technical Field

The present inventive concept relates to a data storage system, and more particularly, to a data storage system and a data retention method thereof.

2. Discussion of the Related Art

Semiconductor memory devices include volatile and non-volatile forms. Volatile semiconductor memory devices have fast read and write speeds, but lose stored content in the absence of power. In contrast, non-volatile semiconductor memory devices have relatively slow read and write speeds, yet they retain stored content when not powered. Thus, to store data in an environment where there may be no continuous supply of power, the non-volatile semiconductor memory device is used.

Nonvolatile semiconductor memory devices may include phase-change random access memory (PRAM), mask read-only memory (MROM), programmable read-only memory (PROM), erasable programmable read-only memory (EPROM), and electrically erasable programmable read-only memory (EEPROM). In general, MROM, PROM, and EPROM are programmed by the manufacturer, rather than by ordinary users. On the other hand, EEPROM is able to be electrically erased and programmed by an ordinary user, and thus it is widely used for system programming needing continuous updating or as an auxiliary memory device. Particularly, since a flash EEPROM (hereinafter, referred to as a flash memory device) has a higher degree of integration than a conventional EEPROM, it is very often used as a large-capacity auxiliary memory device.

A flash memory device periodically performs a retention operation so that it can retain data programmed to a plurality of its memory cells beyond a predetermined period of time.

In the retention operation, the flash memory device is connected to a host, internally measures a retention period and performs data retention in intervals of the retention period. However, if the flash memory device is in an offline state, e.g., not connected to the host, for a longer period of time than the retention period, the state of the data cannot be secured. Accordingly, there is a need to secure the state of data programmed to memory cells in flash memory devices in the offline state.

SUMMARY

According to an exemplary embodiment of the present inventive concept, there is provided a data retention method. The data retention method includes sampling a plurality of nonvolatile memory devices included in a data storage device to detect retention information for each of the nonvolatile memory devices in response to a request of a host and outputting, from the data storage device to the host, sampling data based on a result of the sampling; determining, at the host, whether to perform a retention operation on each of the nonvolatile memory devices based on the sampling data; and performing the retention operation on each of the nonvolatile memory devices based on a result of the determination.

The sampling includes reading data from all memory cells comprised in each of the nonvolatile memory devices.

The sampling includes reading data from less than all of a plurality of memory cells comprised in each of the nonvolatile memory devices.

The sampling data is based on a determination made by each of the nonvolatile memory devices, the determination being whether to perform the retention operation on a plurality of memory cells comprised in the nonvolatile memory device.

The sampling is performed in accordance with a sampling method identified in the request of the host.

The data retention method further comprises: detecting, at the data storage device, a read voltage shift value of each of a plurality of memory cells comprised in the sampling data, the read voltage shift value being a number of shifts the read voltage has undergone from a reference read voltage; and determining whether to perform the retention operation comprises: outputting, from the host to the data storage device, a request instructing each nonvolatile memory device to perform the retention operation on a block comprising memory cells whose read voltage shift values fall in a predetermined reference range.

The data retention method further comprises: detecting, at the data storage device, a number of read errors in each of a plurality of memory cells comprised in the sampling data; and determining whether to perform the retention operation comprises: outputting, from the host to the data storage device, a request instructing each nonvolatile memory device to perform the retention operation on a block comprising memory cells whose number of read errors is greater than a predetermined reference value.

The retention operation is performed on each of the nonvolatile memory devices in response to a request of the host, the request being based on a read voltage shift value or a number of read errors in the sampling data.

The retention operation is performed in a corresponding retention period of each of the nonvolatile memory devices.

According to an exemplary embodiment of the present inventive concept, there is provided a data storage system including a plurality of nonvolatile memory devices configured to write data received from a host; and a controller configured to sample the plurality of nonvolatile memory devices to detect retention information for each of the nonvolatile memory devices in response to a request of the host and output, to the host, sampling data based on a result of the sampling. The host is configured to determine whether to perform a retention operation on each of the nonvolatile memory devices based on the sampling data and control the performance of the retention operation on each of the nonvolatile memory devices based on a result of the determination.

The sampling includes reading data from all memory cells comprised in each of the nonvolatile memory devices.

The sampling includes reading data from less than all of a plurality of memory cells comprised in each of the nonvolatile memory devices.

The sampling data is based on a determination made by each of the nonvolatile memory devices, the determination being whether to perform the retention operation on a plurality of memory cells comprised in the nonvolatile memory device.

The sampling is performed in accordance with a sampling method identified in the request of the host.

The controller is configured to detect a read voltage shift value of each of a plurality of memory cells comprised in the sampling data, the read voltage shift value being a number of shifts the read voltage has undergone from a reference read voltage; and the host is configured to output a request instructing each nonvolatile memory device to perform the retention operation on a block comprising memory cells whose read voltage shift values fall in a predetermined reference range.

The controller is configured to detect a number of read errors in each of a plurality of memory cells comprised in the sampling data; and the host is configured to output a request instructing each nonvolatile memory device to perform the retention operation on a block comprising memory cells whose number of read errors is greater than a predetermined reference value.

The host is configured to send a request to the controller to control the performance of the retention operation on each of the nonvolatile memory devices, the request being based on a read voltage shift value or a number of read errors in the sampling data.

The controller includes a timer that counts a retention period of each of the nonvolatile memory devices, wherein the retention operation is performed in a corresponding retention period of each of the nonvolatile memory devices.

According to an exemplary embodiment of the present inventive concept, there is provided a non-transitory computer readable recording medium tangibly embodying computer readable codes executable by a processor to perform method steps, the method steps comprising: performing a sampling operation on each of a plurality of nonvolatile memory devices included in a data storage device and outputting, to a host, sampling data as a result of the sampling operation, the sampling operation being performed in response to a first request of the host; and performing a retention operation on at least one of the plurality of nonvolatile memory devices in response to a second request of the host, the second request being based on the sampling data.

The retention operation is performed on the at least one nonvolatile memory device based on a determination that the retention operation was not performed on the at least one nonvolatile memory device due to the host and the data storage device being disconnected from each other.

BRIEF DESCRIPTION OF THE DRAWINGS

The above and other features of the present inventive concept will become more apparent by describing in detail exemplary embodiments thereof with reference to the attached drawings in which:

FIG. 6 is a flowchart of a data retention method as a comparison example;

FIG. 7 is a flowchart of a data retention method according to an exemplary embodiment of the present inventive concept;

FIGS. 8A and 8B are diagrams for explaining the data retention method illustrated in FIG. 7;

DETAILED DESCRIPTION OF THE EMBODIMENTS

Exemplary embodiments of the present inventive concept will be described more fully hereinafter with reference to the accompanying drawings. This inventive concept may, however, be embodied in many different forms and should not be construed as limited to the embodiments set forth herein. Like reference numbers may refer to like elements throughout the drawings and the following description.

It will be understood that when an element is referred to as being "connected" or "coupled" to another element, it can be directly connected or coupled to the other element or intervening elements may be present.

As used herein, the singular forms "a," "an" and "the" are intended to include the plural forms as well, unless the context clearly indicates otherwise.

Figure 1:
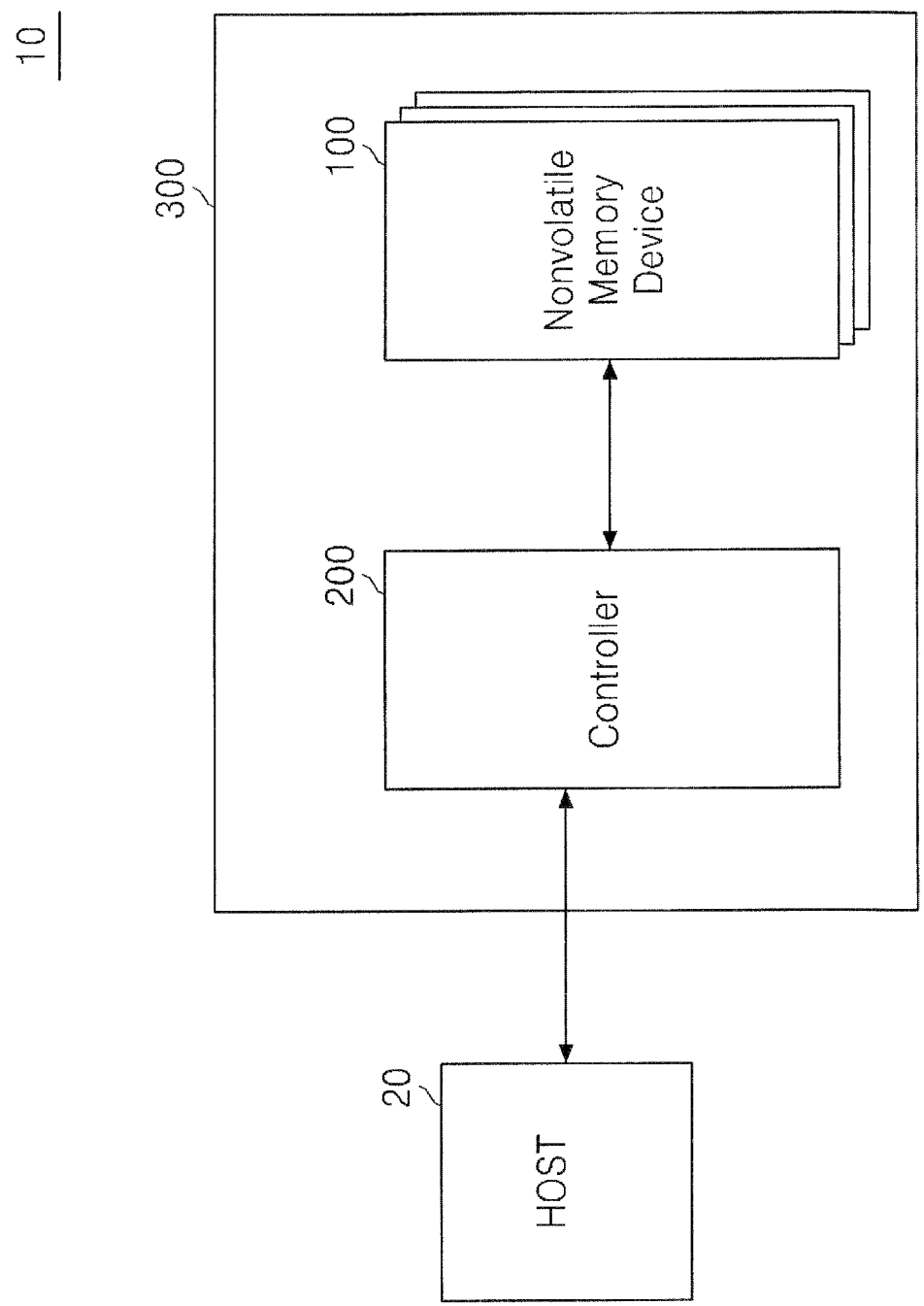
FIG. 1 is a block diagram of a data storage system according to an exemplary embodiment of the present inventive concept.

FIG. 1 is a block diagram of a data storage system 10 according to an exemplary embodiment of the present inventive concept. The data storage system 10 includes a data storage device 300 and a host 20. The data storage device 300 may include at least one nonvolatile memory device 100 and a controller 200 which controls the operation of the at least one nonvolatile memory device 100.

The host 20 may communicate with the data storage device 300 using an interface protocol such as peripheral component interconnect express (PCI-E), advanced technology attachment (ATA), serial ATA (SATA), parallel ATA (PATA), or serial attached SCSI (SAS). However, the interface protocol between the host 20 and the data storage device 300 is not restricted to the above examples, and may be a universal serial bus (USB) protocol, a multi-media card (MMC) protocol, or an integrated drive electronics (IDE) protocol.

The data storage device 300 may be a solid state drive (SSD) or a memory card (e.g., a secure digital (SD) card or an MMC), but the present inventive concept is not restricted thereto. The nonvolatile memory device 100 may be a flash memory device, but the present inventive concept is not restricted thereto. The nonvolatile memory device 100 may be a phase-change random access memory (PRAM) device, a magnetic RAM (MRAM) device, a resistive RAM (ReRAM) device, or a ferroelectric RAM (FeRAM) device. When the nonvolatile memory device 100 is a flash memory device, it may be a NAND flash memory device using a floating gate or a charge trap flash (CTF). Memory cell transistors included in the nonvolatile memory device 100 may be arranged in two dimensions or in three dimensions.

The controller 200 controls the operation of the data storage device 300 and controls the data exchange between the host 20 and the nonvolatile memory device 100. For instance, the controller 200 controls the nonvolatile memory device 100 to write or read data at the request of the host 20. The controller 200 also controls a series of internal operations (e.g., performance adjustment, merging, and wear leveling) needed for the characteristics and/or the efficient management of the nonvolatile memory device 100.

The controller 200 drives firmware and/or software for controlling the operation of the nonvolatile memory device 100. The firmware and/or software may be referred to as a flash translation layer (FTL) (not shown). The operation of the controller 200 will be described in detail later.

The nonvolatile memory device 100 is a storage device for storing data in a nonvolatile manner. It may store an operating system (OS), a variety of programs, and diverse types of data.

Figure 2:
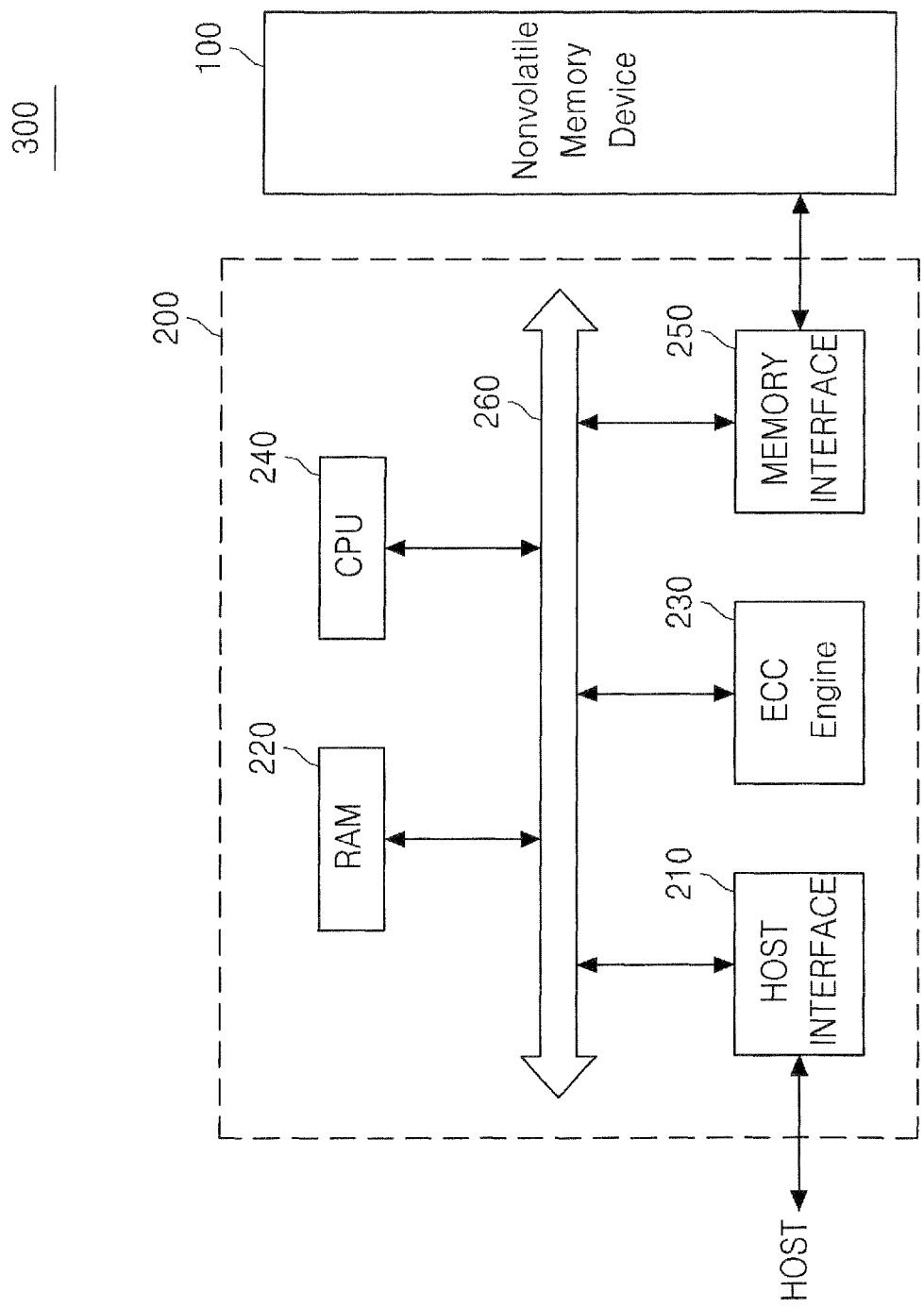
FIG. 2 is a block diagram of a data storage device according to an exemplary embodiment of the present inventive concept.

FIG. 2 is a block diagram of the data storage device 300 according to an exemplary embodiment of the present inventive concept. The data storage device 300 includes the controller 200 which controls data exchange between the host 20 and the nonvolatile memory device 100. The controller 200 includes a host interface 210, a random access memory (RAM) 220, an error correction code (ECC) engine 230, a central processing unit (CPU) 240, and a memory interface 250 connected to a bus 260. The controller 200 may carry out an FTL implemented in software or firmware.

The host 20 sends an operation command (e.g., a read command, a program command, or an erase command), an address, and data to the host interface 210. The host interface 210 includes a data exchange protocol of the host 20 connected with the data storage device 300.

The RAM 220 is used as an operation memory of the CPU 240 and may be implemented by a dynamic RAM (DRAM) or a static RAM (SRAM). The RAM 220 may also function as a buffer memory and temporarily store data transmitted from the host 20.

The ECC engine 230 detects and corrects errors in data that has been read from the nonvolatile memory device 100 or data to be written to the nonvolatile memory device 100.

The memory interface 250 interfaces with the nonvolatile memory device 100.

The CPU 240 performs control for a data exchange operation of the controller 200. The CPU 240 performs sampling on the nonvolatile memory device 100 to detect retention information corresponding to the nonvolatile memory device 100 at the request of the host 20 and sends sampling data to the host 20 based on a result of the sampling.

The retention information indicates whether there is a need to perform a retention operation in which a program operation is periodically or non-periodically performed on the nonvolatile memory device 100 to secure the reliability of data stored in the nonvolatile memory device 100. Data retention may be carried out by erasing data from each of a plurality of blocks in the nonvolatile memory device 100, in which data is erased in units of blocks, and then writing the data to another block in the nonvolatile memory device 100.

The sampling is an operation of reading data from each of a plurality of pages in the nonvolatile memory device 100 to detect retention information of data stored in each of a plurality of memory cells in the nonvolatile memory device 100. A block including a page determined to require the retention operation based on the sampling result may be output as sampling data.

The CPU 240 may perform sampling on the nonvolatile memory device 100 by reading data from the entire area of the nonvolatile memory device 100 or from particular blocks in the nonvolatile memory device 100 and output sampling data based on the sampling result.

Alternatively, the nonvolatile memory device 100 may perform sampling based on a result of judging the state of memory cells included in the nonvolatile memory device 100 and output sampling data based on the sampling result. For instance, the nonvolatile memory device 100 may output, as the sampling data, blocks which include memory cells on which a program/erase operation has been performed many times or blocks which include memory cells on which the earliest write operation was performed.

The host 20 may send a request to the CPU 240 according to the interface protocol so that the sampling is performed on the nonvolatile memory device 100 using at least one of the methods described above.

The FTL may detect a shift value of a read voltage from a reference read voltage when data is read from memory cells included in the sampling data output from the CPU 240 and determine whether to perform a retention operation on the nonvolatile memory device 100 based on the shift value of the read voltage. A method of determining whether to perform the retention operation is illustrated in FIG. 5.

Figure 5:
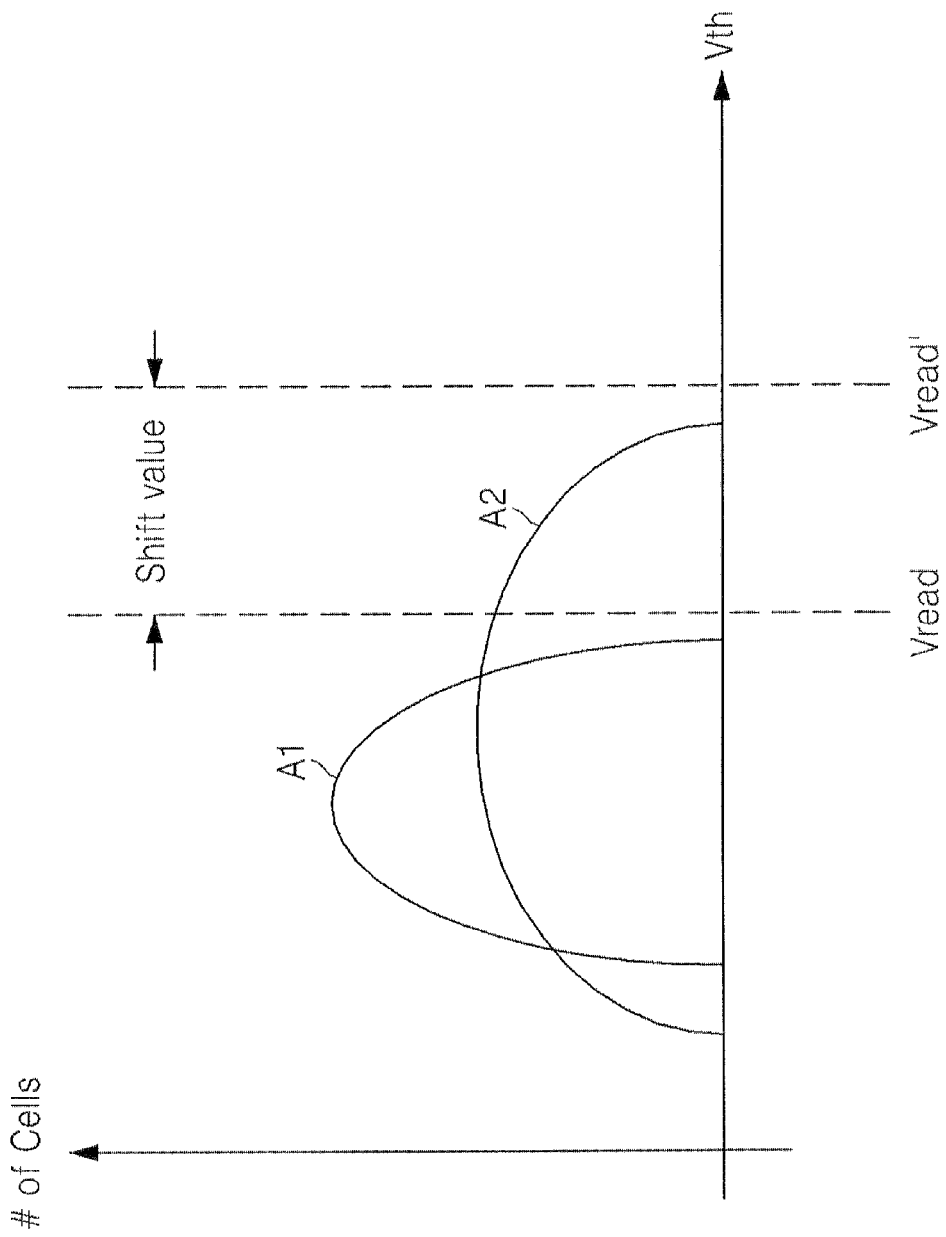
FIG. 5 is a diagram for explaining a method of determining whether to perform a retention operation in a nonvolatile memory device according to an exemplary embodiment of the present inventive concept.

FIG. 5 is a diagram for explaining a method of determining whether to perform a retention operation in the nonvolatile memory device 100 according to an exemplary embodiment of the present inventive concept. Referring to FIG. 5, curve A1 shows the threshold voltage distribution of memory cells in an initial state and curve A2 shows the threshold voltage distribution of memory cells shifted as a predetermined period of time elapses after a program/erase cycle.

At this time, the FTL may determine whether the retention operation will be performed based on the number of shifts that memory cells included in a block included in the sampling data output from the CPU 240 have undergone from a reference read voltage Vread to a maximum read voltage Vread' when data is read from the memory cells based on the reference read voltage Vread.

For instance, when a read voltage of memory cells included in a page of the block included in the sampling data have undergone at least one to five shifts from the reference read voltage Vread in a read operation, the FTL determines that the retention operation is to be performed on the memory cells. When the read voltage of the memory cells is lower than the reference read voltage Vread or the memory cells have undergone more than five shifts from the reference read voltage Vread, the FTL determines that the retention operation is not necessary or is not possible for the memory cells.

As an alternative, the FTL may control the data storage device 300 to perform the retention operation on a block that includes a memory cell having the largest number of read voltage shifts below the maximum read voltage Vread' or a block that includes memory cells from which data has been read using a read voltage shifted below the maximum read voltage Vread' and for which an average read voltage is higher than a predetermined reference value, among memory cells included in a page of a block included in the sampling data.

Alternatively, referring back to FIG. 2, the FTL (not shown) may determine whether the retention operation will be performed based on the number of read errors occurring in memory cells included in each of a plurality of pages included in the sampling data. In other words, based on the number of errors occurring in each page when the pages included in the sampling data are read, it is determined whether the retention operation will be performed.

For instance, the FTL, may determine that the retention operation is necessary for a block including a page having a number of errors that is greater than a predetermined reference value when the pages included in the sampling data are read.

The FTL may control the data storage device 300 after determining whether the retention operation is necessary for the nonvolatile memory device 100 based on the shift value of a read voltage or the number of read errors present in the sampling data at the request of the host 20.

Although not shown, it is apparent to those of ordinary skill in the art that the data storage device 300 may also include a read-only memory (ROM) storing code data for interfacing with the host 20.

The nonvolatile memory device 100 may include a plurality of nonvolatile memory devices, each of which may be implemented by a NAND flash memory device that includes a memory cell array consisting of a plurality of memory cells. An example of the nonvolatile memory device 100 is illustrated in FIG. 3.

Figure 3:
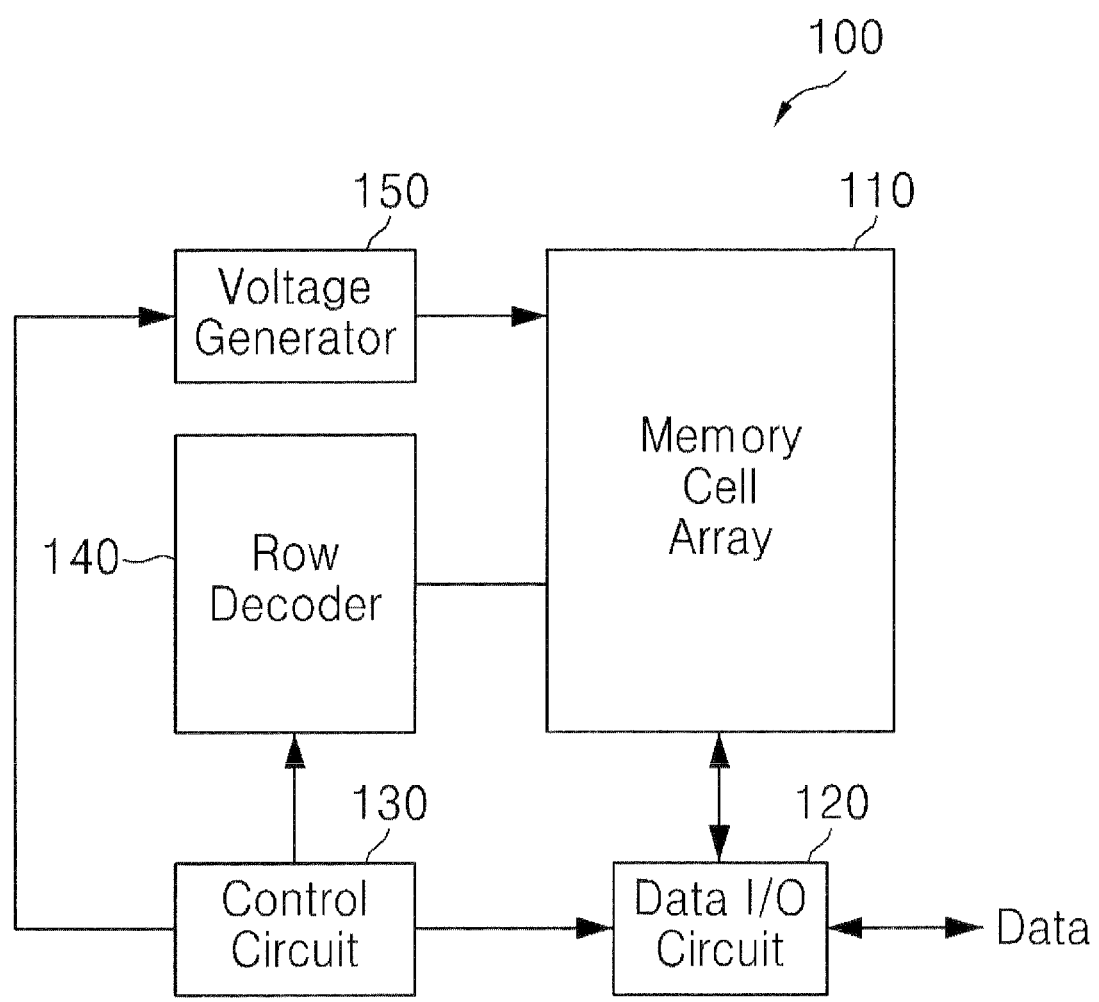
FIG. 3 is a block diagram of a nonvolatile memory device according to an exemplary embodiment of the present inventive concept.
Figure 4:
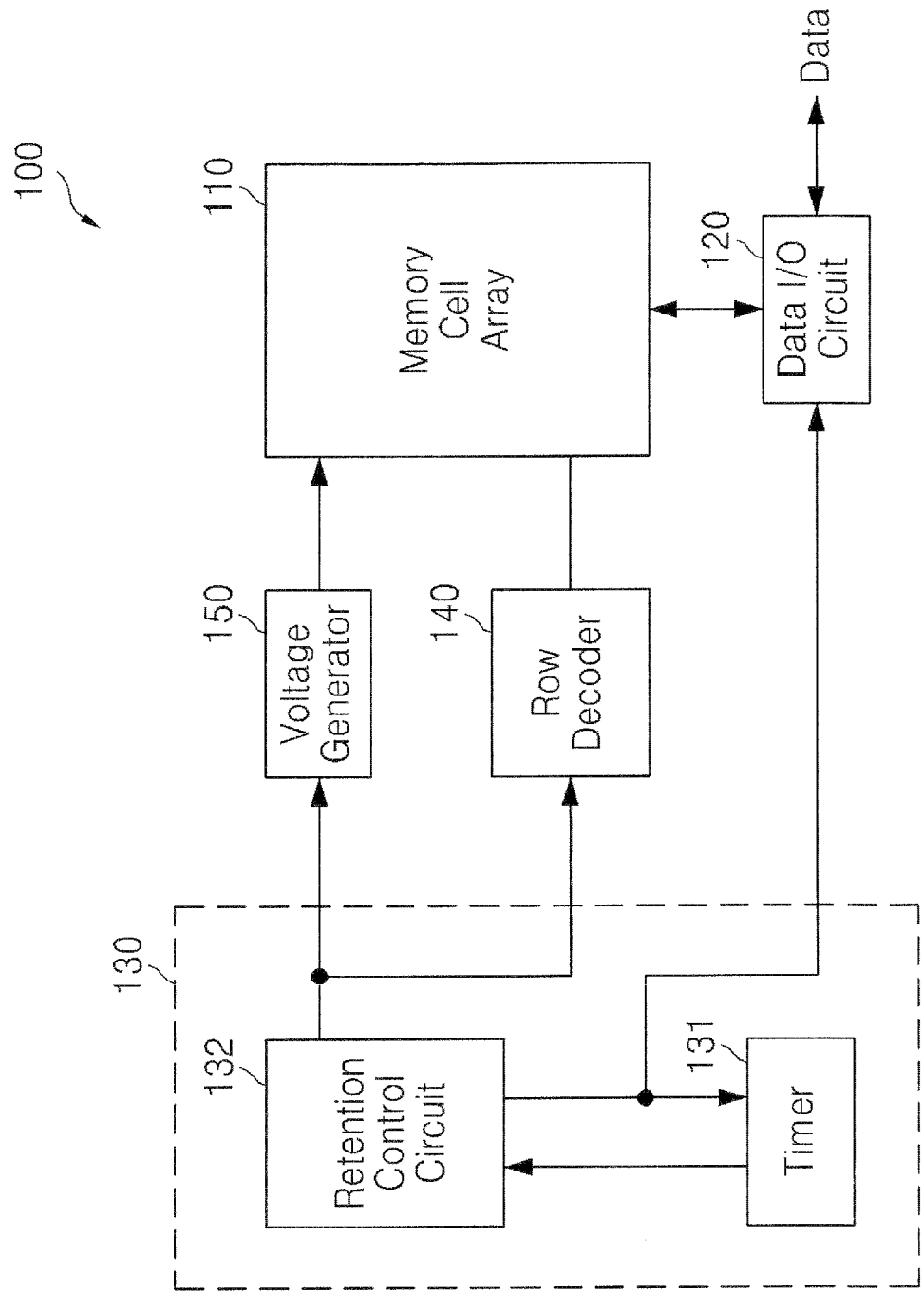
FIG. 4 is a block diagram of the nonvolatile memory device, in which a control circuit illustrated in FIG. 3 is illustrated in detail according to an exemplary embodiment of the present inventive concept.

FIG. 3 is a block diagram of the nonvolatile memory device 100 according to an exemplary embodiment of the present inventive concept. FIG. 4 is a block diagram of the nonvolatile memory device 100, in which a control circuit 130 illustrated in FIG. 3 is illustrated in detail according to an exemplary embodiment of the present inventive concept.

Referring to FIGS. 3 and 4, the nonvolatile memory device 100 may include a memory cell array 110, a data input/output (I/O) circuit 120, a control circuit 130, a row decoder 140, and a voltage generator 150.

The memory cell array 110 includes a plurality of memory cells each connected with a word line and a bit line.

The data I/O circuit 120 receives external data. The data I/O circuit 120 is connected with the memory cell array 110 and temporarily stores data to be programmed to a selected memory cell among the plurality of memory cells. The data stored in the data I/O circuit 120 is programmed to the selected memory cell in a program operation. In addition, the data I/O circuit 120 reads data from a selected memory cell through a bit line and outputs the data to the outside.

The control circuit 130 controls the internal elements of the nonvolatile memory device 100 and controls a retention operation. In addition, the control circuit 130 generates internal control signals (not shown) for controlling the operations (e.g., a program operation, an erase operation, and a read operation) of the nonvolatile memory device 100. Referring to FIG. 4, the control circuit 130 may include a timer 131 and a retention control circuit 132.

The timer 131 counts a retention period so that a retention operation is performed on the memory cell array 110 based on the retention period of the nonvolatile memory device 100. The retention period may vary with the characteristics of each of the plurality of nonvolatile memory devices included in the nonvolatile memory device 100.

At the request of the host 20, the retention control circuit 132 controls the operation of the nonvolatile memory device 100 so that the retention operation of the memory cell array 110 can be performed. In other words, the retention control circuit 132 controls the internal elements of the nonvolatile memory device 100 so that the retention operation is performed on memory cells based on the determination result obtained by the FTL in the retention period counted by the timer 131.

The timer 131 counts the retention period of the memory cell array 110 and performs the retention operation on the memory cells in the nonvolatile memory device 100 in response to a control signal of the retention control circuit 132.

Referring back to FIGS. 3 and 4, the row decoder 140 is connected with the memory cell array 110 via a plurality of word lines and selects one of the word lines based on a control signal (not shown) of the control circuit 130.

The voltage generator 150 generates voltages (e.g., a program voltage, a pass voltage, and a read voltage) necessary for the operations of the nonvolatile memory device 100.

The voltage generator 150 generates word line voltages (not shown) and bit line voltages (not shown) necessary for the operations of the nonvolatile memory device 100 and provides them to word lines and bit lines in the memory cell array 110. The word line voltages include a program voltage provided when a program operation is performed on a memory cell and a verify voltage provided when a verify operation is performed on a programmed memory cell.

The voltage generator 150 may provide the program voltage to a selected word line and the pass voltage to unselected word lines. In this case, the program voltage is higher than the pass voltage and the pass voltage is higher than the read voltage.

FIG. 6 is a flowchart of a data retention method as a comparison example. Referring to FIG. 6, when the data storage device 300 is connected with the host 20 in operation S110, the controller 200 performs sampling on each of the plurality of nonvolatile memory devices that may be included in the nonvolatile memory device 100 using at least one of a plurality of sampling methods and outputs sampling data based on a result of the sampling in operation S120.

Whether to perform a retention operation on each of the plurality of nonvolatile memory devices is determined based on the sampling data in operation S130. The retention operation is performed on a block of a nonvolatile memory device requiring retention among the plurality of nonvolatile memory devices in operation S140.

According to the retention method illustrated in FIG. 6, data retention is performed by the data storage device 300, and therefore, the host 20 cannot check retention information of the nonvolatile memory device 100 when the data storage device 300 is reconnected with the host 20 after being disconnected from the host 20. In other words, the host 20 cannot determine the extent of the retention that had been performed on memory cells in the nonvolatile memory device 100 and which area in the nonvolatile memory device 100 retention still needs to be performed.

FIG. 7 is a flowchart of a data retention method according to an exemplary embodiment of the present inventive concept. When the data storage device 300 is connected with the host 20 in operation S210, the host 20 requests retention information of a plurality of memory cells in the nonvolatile memory device 100 from the controller 200 in operation S220.

The controller 200 performs sampling on the nonvolatile memory device 100 using at least one of a plurality of sampling methods at the request of the host 20 in operation S230 and outputs sampling data based on a result of the sampling in operation S240.

Based on a determination made by the FTL about the sampling data, the host 20 determines whether to perform a retention operation on the nonvolatile memory device 100 in operation S250. In the case a retention operation is determined to be performed, the host 20 sends a request to the controller 200 to perform the retention operation on a particular area of the nonvolatile memory device 100 according to the retention period of the nonvolatile memory device 100 in operation S260. At this time, the host 20 may request the controller 200 to perform the retention operation on every one of the plurality of nonvolatile memory devices that may be included in the nonvolatile memory device 100 requiring retention or to perform the retention operation individually on each of the plurality of nonvolatile memory devices.

At the request of the host 20, the controller 200 performs the retention operation on a block of a nonvolatile memory device requiring retention among the plurality of nonvolatile memory devices in operation S270.

As described above, the host 20 gets information about an area requiring retention in the nonvolatile memory device 100 based on data output from the controller 200, thereby being able to control the retention operation performed on the nonvolatile memory device 100.

Figure 8B:
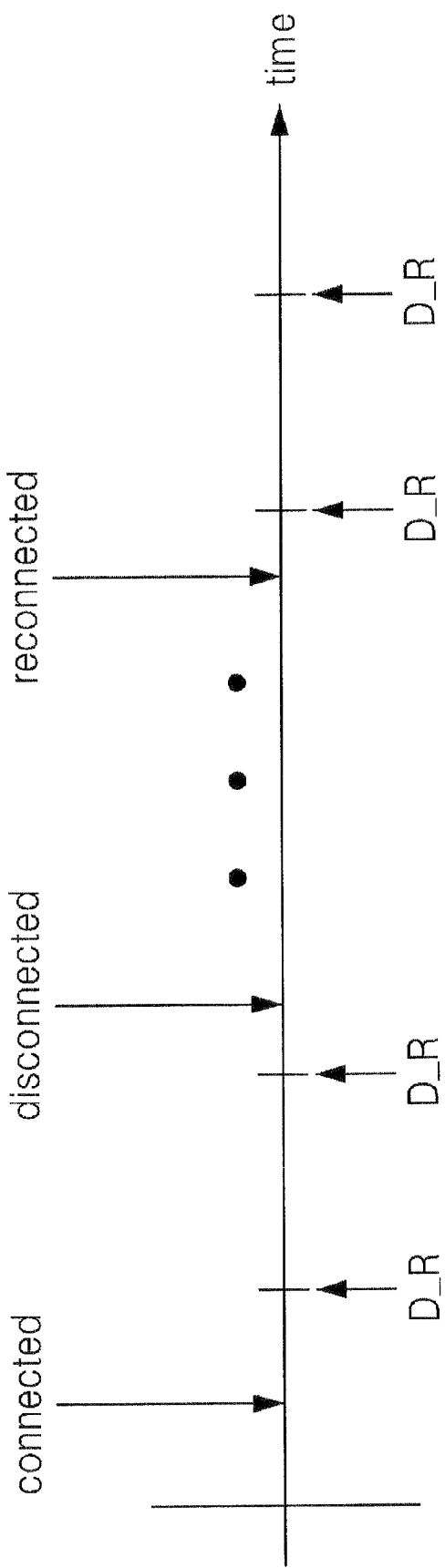

FIGS. 8A and 8B are diagrams for explaining the data retention method illustrated in FIG. 7. Referring to FIG. 8A, when the data storage device 300 is reconnected with the host 20 after the data storage device 300 is disconnected from the host 20 while the data storage device 300 was performing a retention operation based on a retention period D_R of a nonvolatile memory device 100, since the retention method corresponds to that shown in FIG. 6, the host 20 cannot check retention information regarding the nonvolatile memory device 100 and thus cannot determine whether to perform the retention operation on a particular area of the nonvolatile memory device 100.

However, referring to FIG. 8B, the controller 200 can perform a sampling on the nonvolatile memory device 100 after the data storage device 300 is reconnected with the host 20, since it employs the data retention method according to the exemplary embodiment of the present inventive concept shown in FIG. 7. Therefore, based on a result of the sampling, the data storage device 300 can perform the retention operation on areas of the nonvolatile memory device 100 on which the retention operation had not been performed while the data storage device 300 and the host 20 were disconnected.

According to the exemplary embodiment of the present inventive concept shown in FIG. 7, a retention operation that had not been performed on a particular area of the nonvolatile memory device 100 during an offline state, e.g., when the data storage device 300 is disconnected from the host 20, may be performed based on the judgment of the host 20, thereby securing the data's reliability.

Figure 9:
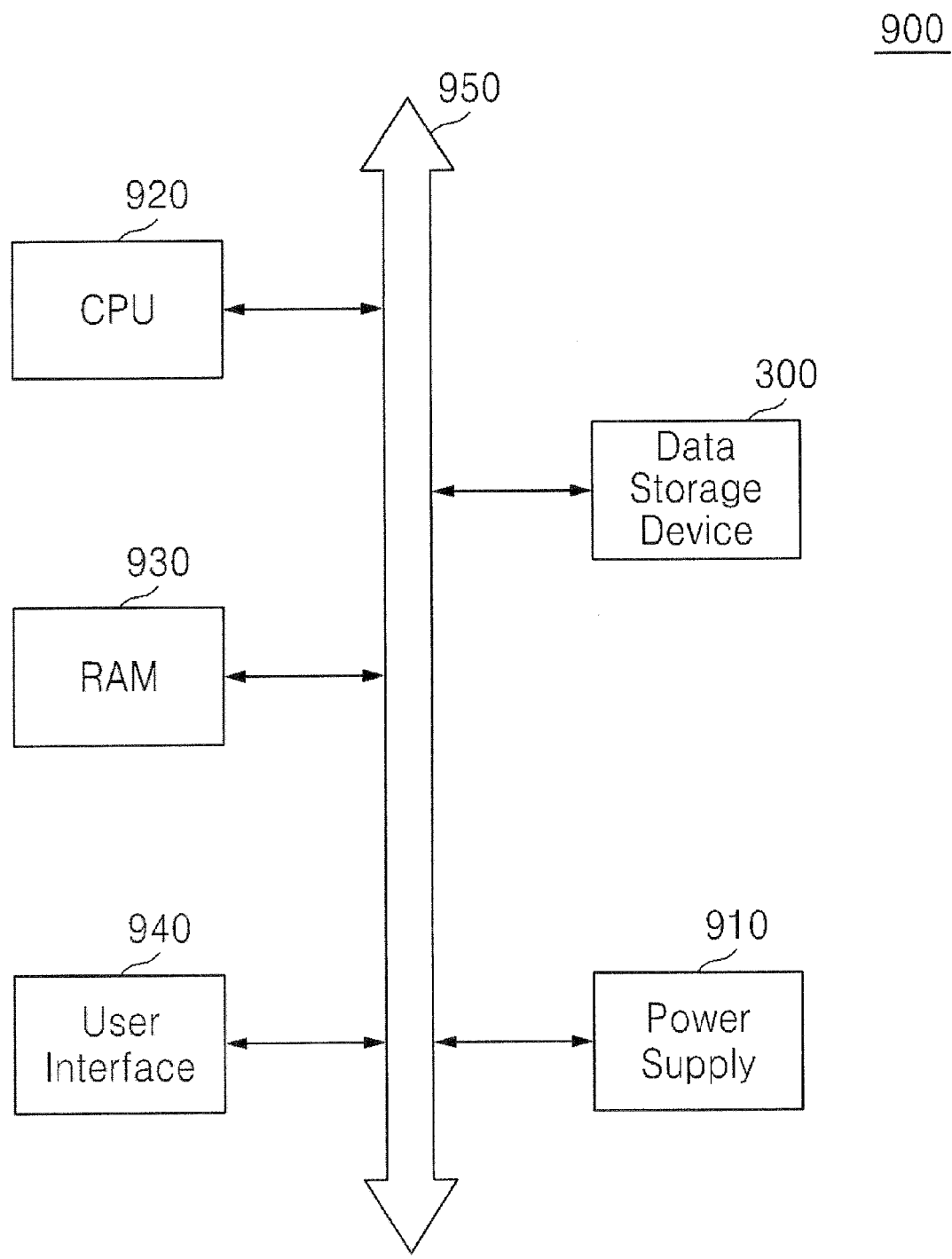
FIG. 9 is a block diagram of an electronic system including a data storage device according to an exemplary embodiment of the present inventive concept.

FIG. 9 is a block diagram of an electronic system 900 including a data storage device 300 according to an exemplary embodiment of the present inventive concept. Referring to FIG. 9, the electronic system 900 according to the present exemplary embodiment may include the data storage device 300, a power supply 910, a CPU 920, a RAM 930, a user interface 940, and a system bus 950 electrically connecting these elements.

The CPU 920 controls the operation of the electronic system 900. The RAM 930 stores information needed for the operation of the electronic system 900. The user interface 940 provides an interface between the electronic system 900 and a user. The power supply 910 supplies electric power to the electronic system's 900 internal constituent elements such as the CPU 920, the RAM 930, the user interface 940, and the data storage device 300.

The CPU 920 may correspond to a host, and the data storage device 300 may store or read data in response to a command from the host.

Figure 10:
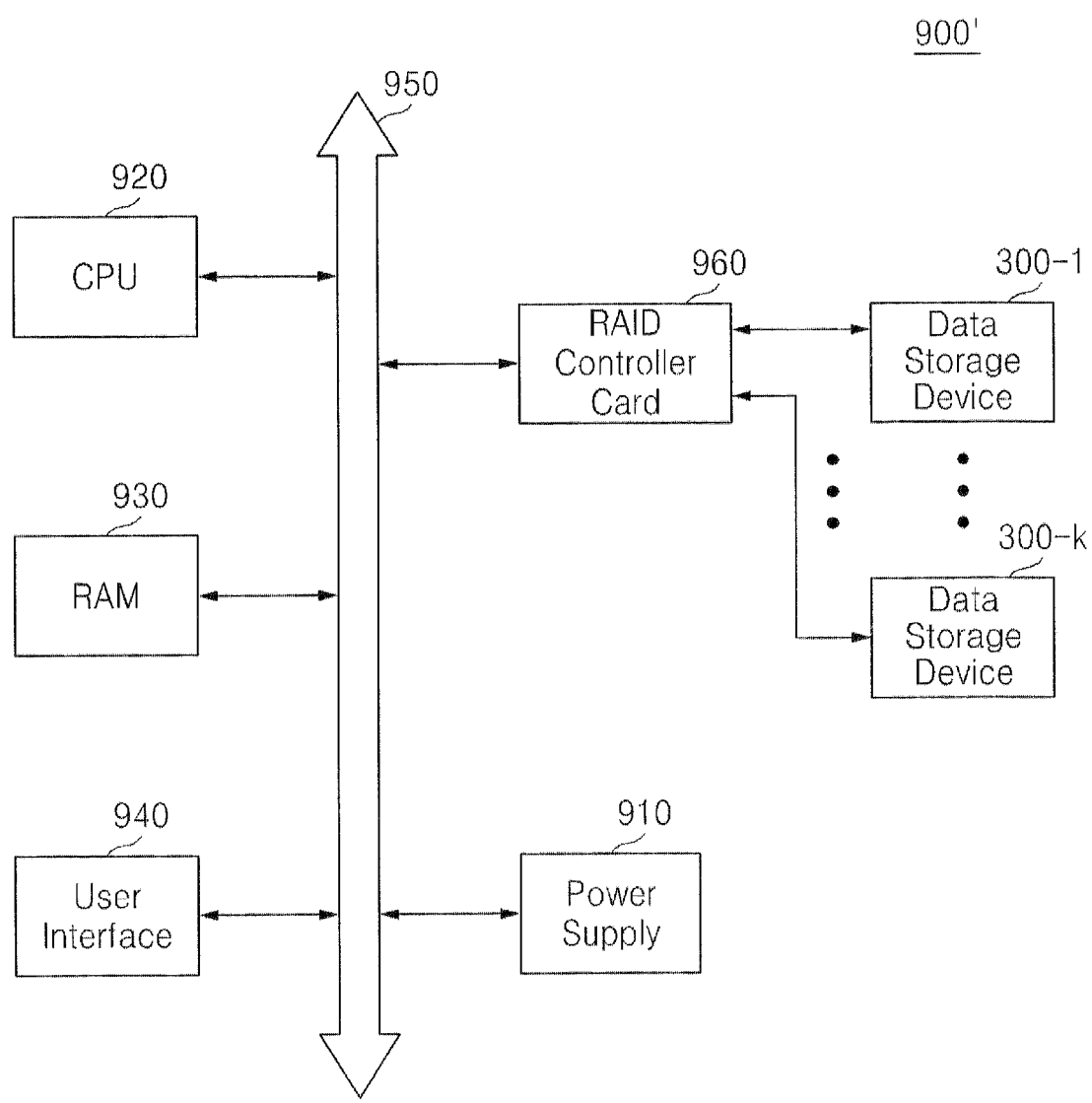
FIG. 10 is a block diagram of an electronic system including a data storage device according to an exemplary embodiment of the present inventive concept.

FIG. 10 is a block diagram of an electronic system 900' including a data storage device 300-1 according to an exemplary embodiment of the present inventive concept. The electronic system 900' illustrated in FIG. 10 has a similar configuration to the electronic system 900 illustrated in FIG. 9, so only differences between the two will be described to avoid repeated descriptions.

The electronic system 900' illustrated in FIG. 10 further includes a RAID controller card 960 as compared with the electronic system 900 illustrated in FIG. 9. The RAID controller card 960 is connected between the host (e.g., the CPU 920) and the data storage device 300 to control the data storage device 300 in accordance with the host. In other words, the data storage device 300 is installed into the RAID controller card 960 and communicates with the host via the RAID controller card 960. In this case, a plurality of data storage devices 300-1 through 300-$k$ may be installed into the RAID controller card 960. The RAID controller card 960 illustrated in FIG. 10 is implemented as a separate product to which the plurality of data storage devices 300-1 through 300-$k$ may be attached.

Figure 11:
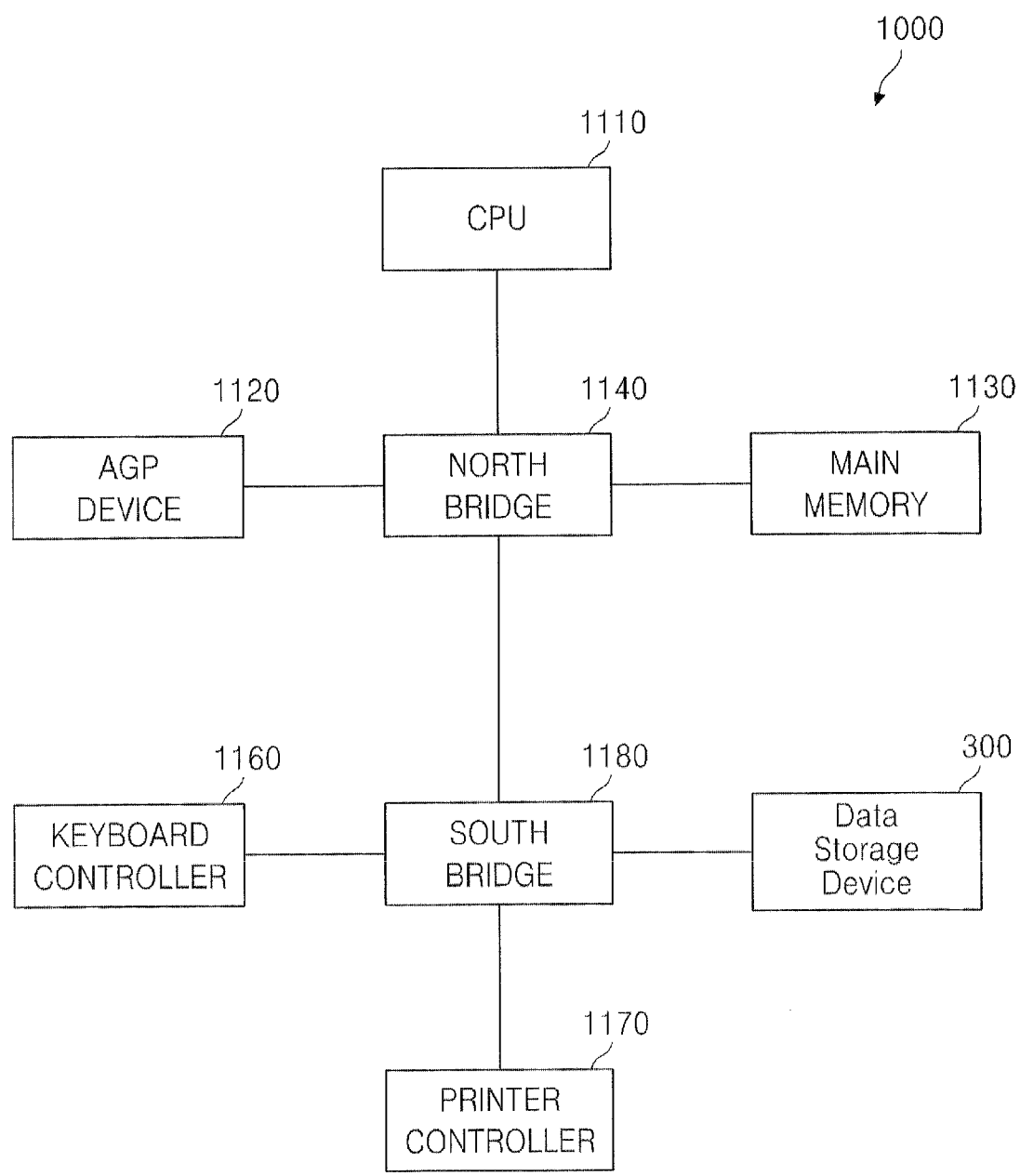
FIG. 11 is a block diagram of a computer system including a data storage device according to an exemplary embodiment of the present inventive concept.

FIG. 11 is a block diagram of a computer system 1000 including a data storage device 300 according to an exemplary embodiment of the present inventive concept. The computer system 1000 includes a computer CPU 1110, and includes an accelerated graphics port (AGP) device 1120 and a main memory 1130 coupled to the computer CPU 1110 via a north bridge 1140. The computer system 1000 further includes a keyboard controller 1160, a printer controller 1170, and the data storage device 300 coupled to the computer CPU 1110 via a south bridge 1180 and the north bridge 1140. The components 1110, 1120, 1130, 1140, 1160, 1170, and 1180 of the computer system 1000 are generally known to one of ordinary skill in the art. The computer system 1000 maybe a personal computer (PC) system or a notebook computer in which the data storage device 300 (e.g., implemented as an SSD) is used as a main storage device instead of a hard disk drive. However, the present inventive concept is not restricted thereto.

The present inventive concept can be embodied as hardware, software, or combinations of hardware and software. The present inventive concept can also be embodied as computer-readable codes on a computer-readable recording medium. The computer-readable recording medium is any data storage device that can store data as a program which can be thereafter read by a computer system. Examples of the computer-readable recording medium include ROM, RAM, compact disk (CD)-ROMs, magnetic tapes, floppy disks, and optical data storage devices. The computer-readable recording medium can also be distributed over network coupled computer systems so that the computer-readable code is stored and executed in a distributed fashion. Moreover, functional programs, codes, and code segments to accomplish an exemplary embodiment the present inventive concept can be construed by programmers skilled in the art to which the present inventive concept pertains.

As described above, in a data storage system and a data retention method of the data storage system according to an exemplary embodiment of the present inventive concept, a retention operation may be performed on data that had not been subject to the retention operation when the data storage device was disconnected from a host, thereby securing the reliability of the data storage device's data.

While the present inventive concept has been particularly shown and described with reference to exemplary embodiments thereof, it will be understood by those of ordinary skill in the art that various changes in form and detail may be made thereto without departing from the spirit and scope of the present inventive concept as defined by the following claims.

What is claimed is:

1. A data retention method, comprising:
    sampling a plurality of nonvolatile memory devices included in a data storage device to detect retention information for each of the nonvolatile memory devices in response to a request of a host and outputting, from the data storage device to the host, sampling data based on a result of the sampling;

determining, at the host, whether to perform a retention operation on each of the nonvolatile memory devices based on the sampling data; and performing the retention operation on each of the nonvolatile memory devices based on a result of the determination.

2. The data retention method of claim 1, wherein the sampling includes reading data from all memory cells comprised in each of the nonvolatile memory devices.

3. The data retention method of claim 1, wherein the sampling includes reading data from less than all of a plurality of memory cells comprised in each of the nonvolatile memory devices.

4. The data retention method of claim 1, wherein the sampling data is based on a determination made by each of the nonvolatile memory devices, the determination being whether to perform the retention operation on a plurality of memory cells comprised in the nonvolatile memory device.

5. The data retention method of claim 1, wherein the sampling is performed in accordance with a sampling method identified in the request of the host.

6. The data retention method of claim 1, further comprising:
detecting, at the data storage device, a read voltage shift value of each of a plurality of memory cells comprised in the sampling data, the read voltage shift value being a number of shifts the read voltage has undergone from a reference read voltage; and
determining whether to perform the retention operation comprises:
outputting, from the host to the data storage device, a request instructing each nonvolatile memory device to perform the retention operation on a block comprising memory cells whose read voltage shift values fall in a predetermined reference range.

7. The data retention method of claim 1, further comprising:
detecting, at the data storage device, a number of read errors in each of a plurality of memory cells comprised in the sampling data; and
determining whether to perform the retention operation comprises:
outputting, from the host to the data storage device, a request instructing each nonvolatile memory device to perform the retention operation on a block comprising memory cells whose number of read errors is greater than a predetermined reference value.

8. The data retention method of claim 1, wherein the retention operation is performed on each of the nonvolatile memory devices in response to a request of the host, the request being based on a read voltage shift value or a number of read errors in the sampling data.

9. The data retention method of claim 1, wherein the retention operation is performed in a corresponding retention period of each of the nonvolatile memory devices.

10. A data storage system, comprising:
a plurality of nonvolatile memory devices configured to write data received from a host; and
a controller configured to sample the plurality of nonvolatile memory devices to detect retention information for each of the nonvolatile memory devices in response to a request of the host and output, to the host, sampling data based on a result of the sampling,
wherein the host is configured to determine whether to perform a retention operation on each of the nonvolatile memory devices based on the sampling data and control the performance of the retention operation on each of the nonvolatile memory devices based on a result of the determination.

11. The data storage system of claim 10, wherein the sampling includes reading data from all memory cells comprised in each of the nonvolatile memory devices.

12. The data storage system of claim 10, wherein the sampling includes reading data from less than all of a plurality of memory cells comprised in each of the nonvolatile memory devices.

13. The data storage system of claim 10, wherein the sampling data is based on a determination made by each of the nonvolatile memory devices, the determination being whether to perform the retention operation on a plurality of memory cells comprised in the nonvolatile memory device.

14. The data storage system of claim 10, wherein the sampling is performed in accordance with a sampling method identified in the request of the host.

15. The data storage system of claim 10, wherein the controller is configured to detect a read voltage shift value of each of a plurality of memory cells comprised in the sampling data, the read voltage shift value being a number of shifts the read voltage has undergone from a reference read voltage; and
the host is configured to output a request instructing each nonvolatile memory device to perform the retention operation on a block comprising memory cells whose read voltage shift values fall in a predetermined reference range.

16. The data storage system of claim 10, wherein the controller is configured to detect a number of read errors in each of a plurality of memory cells comprised in the sampling data; and
the host is configured to output a request instructing each nonvolatile memory device to perform the retention operation on a block comprising memory cells whose number of read errors is greater than a predetermined reference value.

17. The data storage system of claim 10, wherein the host is configured to send a request to the controller to control the performance of the retention operation on each of the nonvolatile memory devices, the request being based on a read voltage shift value or a number of read errors in the sampling data.

18. The data storage system of claim 10, wherein the controller includes a timer that counts a retention period of each of the nonvolatile memory devices, wherein the retention operation is performed in a corresponding retention period of each of the nonvolatile memory devices.

19. A non-transitory computer readable recording medium tangibly embodying computer readable codes executable by a processor to perform method steps, the method steps comprising:
performing a sampling operation on each of a plurality of nonvolatile memory devices included in a data storage device and outputting, to a host, sampling data as a result of the sampling operation, the sampling operation being performed in response to a first request of the host; and
performing a retention operation on at least one of the plurality of nonvolatile memory devices in response to a second request of the host, the second request being based on the sampling data.

20. The computer readable recording medium of claim 19, wherein the retention operation is performed on the at least one nonvolatile memory device based on a determination that the retention operation was not performed on the at least one nonvolatile memory device due to the host and the data storage device being disconnected from each other.

* * * * *